(12) United States Patent
Aoyama

(10) Patent No.: US 6,320,618 B1
(45) Date of Patent: *Nov. 20, 2001

(54) SEMICONDUCTOR IMAGE SENSOR WITH A PLURALITY OF DIFFERENT RESOLUTION AREAS

(75) Inventor: Chiaki Aoyama, Wako (JP)

(73) Assignee: Honda Giken Kogyo Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/919,890

(22) Filed: Aug. 28, 1997

(30) Foreign Application Priority Data

Aug. 30, 1996 (JP) .................................. 8-229643

(51) Int. Cl.[7] .............................. H04N 7/00; G02B 13/16
(52) U.S. Cl. ........................................... 348/335; 348/113
(58) Field of Search .................................. 348/307, 308, 348/218, 335, 362, 229, 113

(56) References Cited

U.S. PATENT DOCUMENTS

| | | | | |
|---|---|---|---|---|
| 4,554,585 | * | 11/1985 | Carlson | 348/342 |
| 5,055,921 | * | 10/1991 | Usui | 348/27 |
| 5,075,770 | * | 12/1991 | Smyth | 348/272 |
| 5,262,871 | * | 11/1993 | Wilder | 348/307 |
| 5,489,940 | * | 2/1996 | Richardson et al. | 348/335 |

* cited by examiner

Primary Examiner—Wendy R. Garber
Assistant Examiner—Alicia M Harrington
(74) Attorney, Agent, or Firm—Lyon & Lyon LLP

(57) ABSTRACT

A semiconductor image sensor comprises a number of photosensitive elements which are provided as a two dimensional array on a substrate. This image sensor also comprises a plurality of different resolution areas in a single plane. This is made possible by changing the size or density of the photosensitive elements which are used for a respective different resolution areas in the array on the substrate. In this image sensor, an output from each photosensitive element as a pixel composes an image signal. Particularly, if this semiconductor image sensor is designed as a sensor for monitoring forward views of a vehicle, then the photosensitive portion is divided into a plurality of areas in a vertical direction so that a resultant imaging device is suitable for monitoring views from the front of a vehicle, comprising a high resolution area in the upper portion of the photosensitive portion where distant views are captured and subsequently lower resolution areas in the succeeding lower portions of the photosensitive portion where subsequently closer views are captured.

12 Claims, 8 Drawing Sheets

SEMICONDUCTOR IMAGE SENSOR WITH A PLURALITY OF DIFFERENT RESOLUTION AREAS

FIELD OF THE INVENTION

The present invention relates to a semiconductor image sensor which comprises a plurality of photosensitive elements in a two dimensional array and particularly to a semiconductor image sensor which is mounted on a vehicle such as an automobile and is used for monitoring the forward view of the vehicle for the purpose of recognizing the vehicle's forward environment including buildings, other vehicles on the roadway, etc.

BACKGROUND OF THE INVENTION

An image sensor is applied to an automatic navigation system, which is incorporated in a vehicle such as an automobile, for monitoring the forward view of the vehicle so that the automatic navigation system can control such operations of the vehicle as steering to follow a white guiding line which is provided along the roadway by capturing the guiding line with the image sensor or braking appropriately in response to changes in the vehicle's forward environment which may include other vehicles preceding ahead and other objects. In such monitoring, the performance required of the image sensor includes a capacity to detect an obstacle 200 meters or more away ahead of the vehicle. This is especially true for the vehicle to drive on a highway. For this reason, the automatic navigation system has required a camera which incorporates a high-resolution imaging device.

A conventional method for such monitoring has made use of two general television cameras. While one camera equipped with a telephoto lens is used for monitoring distant views in detail, the other camera with an ordinary lens is used for monitoring close views with a wide angle. Another method has utilized the relatively high resolution of a Hi-Vision camera, and views are monitored collectively without any distinction whether they are distant from or close to the vehicle.

However, these methods of the prior art have had problems inherent to the types of camera which are used. One of the problems is that any of the cameras which may be applied as such sensor is so expensive that the hardware of the automatic navigation system which incorporates any of these cameras has been rendered impracticably expensive. Furthermore, if a high-resolution camera such as a Hi-Vision camera is applied as the image sensor for monitoring the forward view of a vehicle, then this image sensor inherently takes in a large amount of information for image formation without any distinction whether the views captured are distant or near. This presents another problem because the images captured by the image sensor can easily overload the image processing capacity of the automatic navigation system. Because of the characteristic of high resolution, Hi-vision cameras are suitable for monitoring distant views. However, when they are used for monitoring near views with the same resolution, they tend to include details which are not really necessary for the object recognition of the automatic navigation system, and the load of image processing required for the recognition of the objects in the views is quite sizable.

It is not necessary for the system to monitor all objects at a constant high resolution. Some objects need to be monitored at a higher resolution. However, it all depends on the condition. For example, in the case shown in FIG. 1 where a camera is mounted on the front of a vehicle to monitor the forward view, the upper portions of the images which are being monitored generally include distant views of the roadway while the lower portions include near views thereof. Therefore, if the upper portions of the images are captured at a relatively high resolution while the lower portions are captured at a relatively low resolution, then the load of data to be processed or the information extracted from the images in the image processing can be effectively reduced or lightened without jeopardizing the recognition of the condition of the roadway. By realizing this feature for the image sensor, a camera for monitoring the forward view of a vehicle can be produced relatively inexpensively.

SUMMARY OF THE INVENTION

The present invention is conceived to solve the problems mentioned above. It is an object of this invention to provide a semiconductor image sensor which comprises areas of different resolution on a single substrate so that the image sensor can effectively discriminate image information and can omit collection of unnecessary part. This semiconductor image sensor can be effectively used to collect a minimum amount of image data or information necessary for recognition of the road condition for a vehicle to operate. While the image sensor monitors forward views of the vehicle from proximity to distance in such a discriminatory way, the load of image data to be processed can be substantially reduced for the system as a whole. As such, a comparatively inexpensive yet effective imaging can be realized for monitoring forward views of a vehicle.

The above objective is realized by a semiconductor image sensor of the present invention which comprises a plurality of different resolution areas on a single substrate. As examples of construction, a first embodiment of semiconductor image sensor comprises a number of photosensitive elements which are provided as a two dimensional array in a plurality of different resolution areas in a single plane on a single substrate by accommodating a different size or density of photosensitive elements for a respective different resolution area. In this image sensor, an output from each photosensitive element as a pixel composes an image signal.

With this construction, for example, it is possible to obtain an image whose central part is rendered in a relatively high resolution to capture clearly an object which is targetted in the monitoring while the other part is rendered in a low resolution. Likewise, the collection of data for image formation can be carried out effectively by minimizing the collection of image signals to those which are really necessary for a particular purpose of monitoring. Thereby, the load of image data to be processed can be substantially reduced as a whole for the system which incorporates this semiconductor image sensor.

A second embodiment of semiconductor image sensor according to the present invention further comprises, in addition to the construction of the first embodiment, a plurality of different resolution areas in a vertical direction. The area of this semiconductor image sensor which images a distant view (e.g., refer to the upper portion of an image in FIG. 1) comprises a high resolution area while areas which image subsequently closer views (e.g., refer to the lower portion of the image in FIG. 1) comprise correspondingly lower resolution areas.

If this semiconductor image sensor is to be mounted on the front of a vehicle and to be used as a sensor for monitoring forward views of the vehicle, then the upper portion of the sensor comprises a sensor section for distant monitoring to capture objects in the distance with a high resolution, and the middle portion of the sensor is used to capture objects more than ten meters but less than a hundred meters away with an intermediate resolution, and the lower portion is used to capture relatively large objects near the vehicle with a low resolution. This arrangement is optimal for monitoring forward views from the front of the vehicle because the sensor reduces or minimizes the amount of data collected for the image formation which is required in the monitoring in correspondence with the distance of the view without losing information necessary for the recognition of the road condition. Thus, this minimized amount of image data lightens the load of the subsequent image processing. However, depending on the condition of a particular monitoring or design of the camera incorporating the semiconductor image sensor, the upper portion of the sensor may comprise a low resolution area, and the lower portion may comprise a high resolution area.

A third embodiment of semiconductor image sensor according to the present invention further comprises, in addition to the constructions of the first and second embodiments, a shutter-speed control circuit which is provided independently for each of the different resolution areas.

With this construction, for example, if the high resolution area of the photosensitive portion is set to monitor distant views, then the exposure time for the high resolution area is set relatively long to capture distant objects clearly because the distant objects move slowly with respect to the vehicle. On the other hand, the exposure time for the low resolution area is set relatively short to keep the sharpness of the image because the closer objects move quickly with respect to the vehicle. In this way, the shutter speed is varied to adjust the exposure time for each respective resolution area.

However, such adjustment of the exposure times can be achieved by another means. A clock signal generator provided for each of the different resolution areas can independently adjust the framing time of a respective resolution area.

A fourth embodiment of semiconductor image sensor according to the present invention further comprises, in addition to the construction of any of the first, second and third embodiments, a circuit for discriminately and partially collecting outputs of the photosensitive elements of at least the high-resolution area in the array.

The amount of information extracted from the high resolution area or a whole set of image signals which are collected from the high-resolution area for forming an image is relatively large. Therefore, it is sometimes advantageous to form an image from a reduced set of image signals especially when details in the image formed from such large amount of information as coming from the high resolution area are not necessary for the monitoring. For this purpose, the above mentioned circuit is effective for partially and selectively collecting the outputs of photosensitive elements which are appropriate for forming a desired partial image, thus reducing the load of the subsequent image processing.

A fifth embodiment of semiconductor image sensor according to the present invention further comprises, in addition to the construction of any of the first, second, third and forth embodiments, a circuit to group the outputs of every adjacent photosensitive elements at least in the high-resolution area to produce a single unified image signal. With this construction, when high-resolution is not required for a particular monitoring, the amount of information extracted from the high-resolution area for forming an image can be easily and substantially reduced to lighten the load of the subsequent image processing. Also, this feature, which reduces the resolution of the high-resolution area by unifying the outputs in groups, can be effective for unifying the whole resolution of the sensor if the sensor is constructed such that the resolution of the high-resolution area reduced by this means equals the resolution of the low resolution area.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only and thus are not limitative of the present invention and wherein.

DESCRIPTION OF THE PREFERRED EMBODIMENTS

Figure 2:
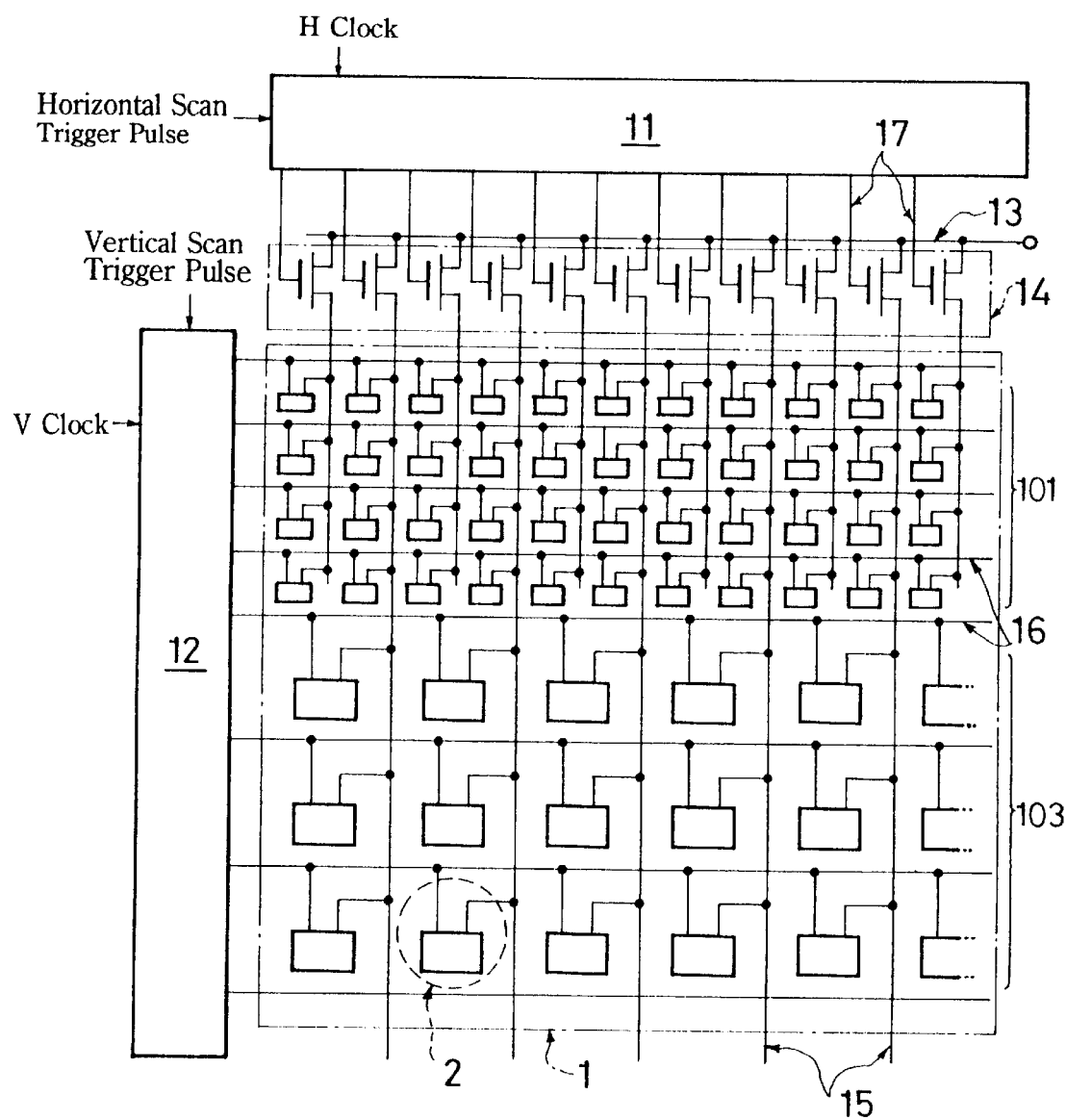
FIG. 2 is a schematic drawing showing the construction of a first semiconductor image sensor according to the present invention.

A preferred embodiment of the present invention is described in the following with reference to the accompanying drawings. FIG. 2 shows a construction for a first embodiment of semiconductor image sensor according to the present invention. This semiconductor image sensor comprises an imaging device of metal oxide semiconductor (MOS), in which a number of imaging elements 2 (or photosensitive elements) are aligned in a plane to form an array 1 of imaging elements. The density of imaging elements in the upper portion of the array 1 (i.e., the portion shown in the upper part of the drawing) is approximately four times higher than that of the lower portion. Therefore, the upper portion represents a high-resolution area 101, and the lower portion represents a low-resolution area 103. Both areas are incorporated on the single substrate of the imaging device, i.e., the semiconductor image sensor. In this semiconductor image sensor, each imaging element 2 is connected to a vertical signal line 15 and to a horizontal signal line 16, respectively. While each vertical signal line 15 is to transmit output signals from a respective column of imaging elements 2 in the array 1 during a scan in the horizontal direction, each horizontal signal line 16 is to select a respective row of imaging elements 2 during a scan in the vertical direction (because of this function, these horizontal signal lines 16 are hereinafter each referred to as "vertical scan selection line").

Figure 3:
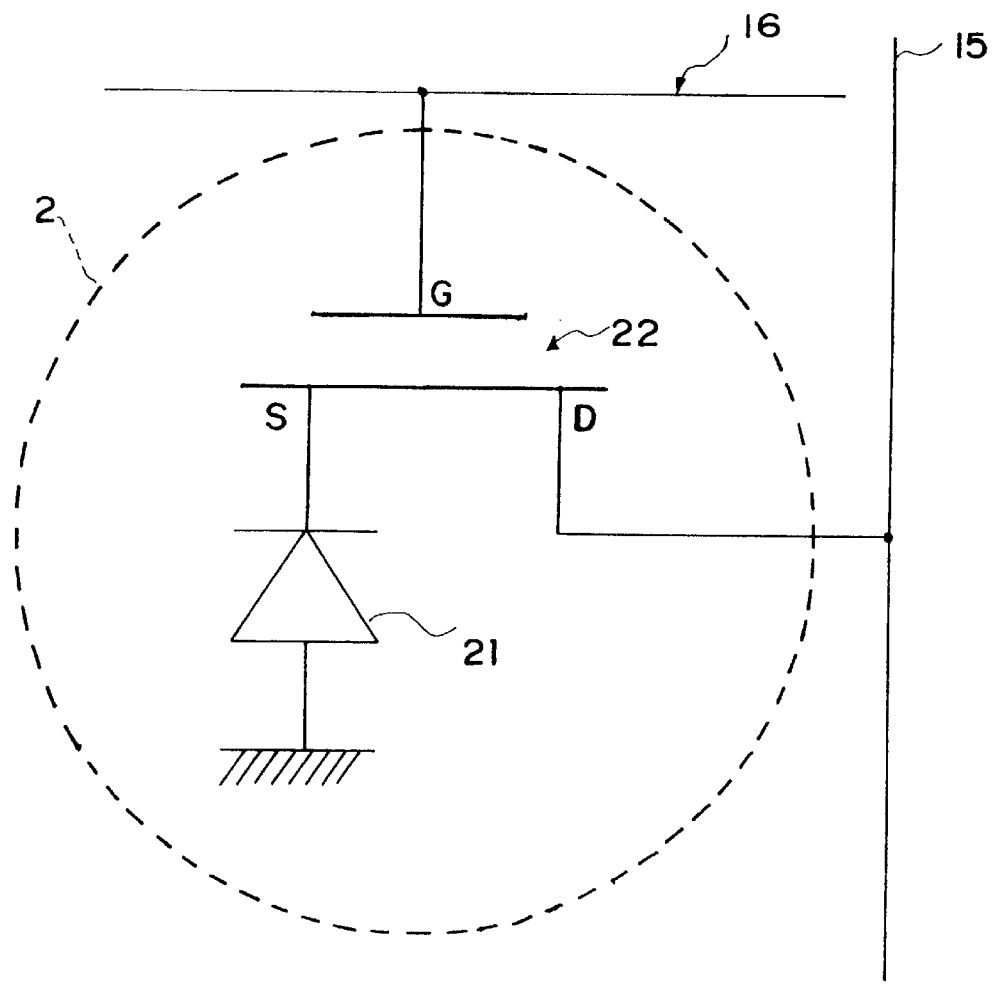
FIG. 3 is an enlarged drawing of an imaging element or pixel of a MOS semiconductor image sensor.

Each imaging element 2 comprises a photo diode 21 and a MOS transistor 22 as shown in FIG. 3. The anode of each photo diode 21 is grounded, and the cathode thereof is connected with the source S of a respective transistor 22, whose drain D is connected as output to a respective vertical signal line 15. The gate G of each transistor 22 is connected to a respective vertical scan selection line 16. As a result, each transistor 22 functions as a switch to open or close the channel of transmission in correspondence with a pulse supplied through the vertical scan selection line 16 during the vertical scan (hereinafter, these transistors are each referred to as "vertical scan transistor").

One end of each vertical signal line 15 is connected to the source of another respective MOS transistor 14, whose drain is connect to an image output line 13, such that each vertical signal line 15 is connected to the image output line 13 through a respective transistor 14. In this configuration, the gate of each transistor 14 is connected to another respective vertical signal line 17, through which a pulse is supplied to open a respective transistor 14 to select a respective column of imaging elements. Switching columns of imaging elements one column after another by the application of a series of pulses through these vertical signal lines 17 enables the horizontal scan (because of this function, these vertical signal lines 17 are hereinafter each referred to as "horizontal scan selection line", and these transistors 14 are each referred to as "horizontal scan transistor").

Although the number of imaging elements 2 which should be incorporated in the array depends on the size of the array and the size and resolution of an image to be obtained, even an array of low resolution must incorporate at least several hundred by several hundred of imaging elements. Thus, it is necessary for the array 1 to include several hundred of vertical scan selection lines 16 and horizontal scan selection lines 17, both of which lines are necessary for selecting each specific respective row or column of imaging elements in the array. Pulses to be supplied to these lines 16 and 17 sequentially are provided by two shift registers, a horizontal shift register 11 and a vertical shift register 12. Because these two shift registers are operated by two clock pulses, H clock and V clock, which correspond with each other, the pulses supplied to the lines 16 and 17 are synchronized.

Now, the operation of this semiconductor image sensor will be described.

After receiving a pulse which triggers the consecutive shift or selection of a row of imaging elements for the process of vertical scan (hereinafter, this pulse is referred to as "vertical scan trigger pulse"), the vertical shift register 12 generates a series of pulses, each of which is applied sequentially to a specific row of imaging elements 2 in the array 1 through a respective vertical scan selection line 16 in synchronization with the V clock during the vertical scan for the read in of image signals to the vertical signal lines 15 (because each of these pulses functions to select a specific row of imaging elements, these pulses are hereinafter referred to as "selection pulses").

The photo diodes 21 of the imaging elements are being electrically charged while the light reflected from objects which are being monitored strikes the imaging elements in the array. While a respective row of vertical scan transistors 22 whose gates are applied with a selection pulse through a respective vertical scan selection line 16 remain conductive, the electrical charges which have been developed in the photo diodes 21 of the specific imaging elements incorporating these transistors are transmitted to the vertical signal lines 15. On the other hand, the other photo diodes 21 of the imaging elements 2 whose transistors are not applied with a selection pulse remain being charged for the time being.

Likewise, after receiving a pulse which triggers the consecutive shift or selection of a column of imaging elements for the process of horizontal scan (hereinafter, this pulse is referred to as "horizontal scan trigger pulse"), the horizontal shift register 11 generates a series of pulses, each of which is applied to the gate of a respective horizontal scan transistor 14 through a respective horizontal scan selection line 17 sequentially, switching the transistors 14 in the horizontal direction for the read out of image signals from the vertical signal lines 15 (because of this function, these pulses are hereinafter referred to as "scanning pulses"). The sequential application of scanning pulses makes the horizontal scan transistors 14 conductive one after another so that the electrical charges, i.e., image signals, held temporarily in the vertical signal lines 15 are transmitted to the image output line 13 sequentially and are output from the terminal of the image output line 13 as image signals in chronological order.

In this scan type semiconductor image sensor, while a selection pulse is applied through a vertical scan selection line 16 to select a respective row of imaging elements 2 in the array 1, scanning pulses are applied to all the horizontal scan transistors 14 one after another sequentially so that the image signals of the respective row of imaging elements 2 are extracted through the vertical signal lines 15 to the image output line 13. As the selection pulses are applied sequentially to scan all the rows of imaging elements 2, all image signals composing a whole image are extracted to the image output line 13.

In this image scan, the selection pulses and the scanning pulses are controlled in synchronization so that the signal charges transmitted to the vertical signal lines 15 are sequentially transferred to the image output line 13. Moreover, as seen from FIG. 2, while the same scanning pulses are applied both to the high-resolution area 101 and to the low-resolution area 103, the period of the scanning pulses which are applied to the low- resolution area 103 is twice the period of the scanning pulses applied to the high-resolution area 101, thus enabling collection of image signals from the two different resolution areas in a single process without any redundant process which might be otherwise required for each respective resolution area.

Figure 4:
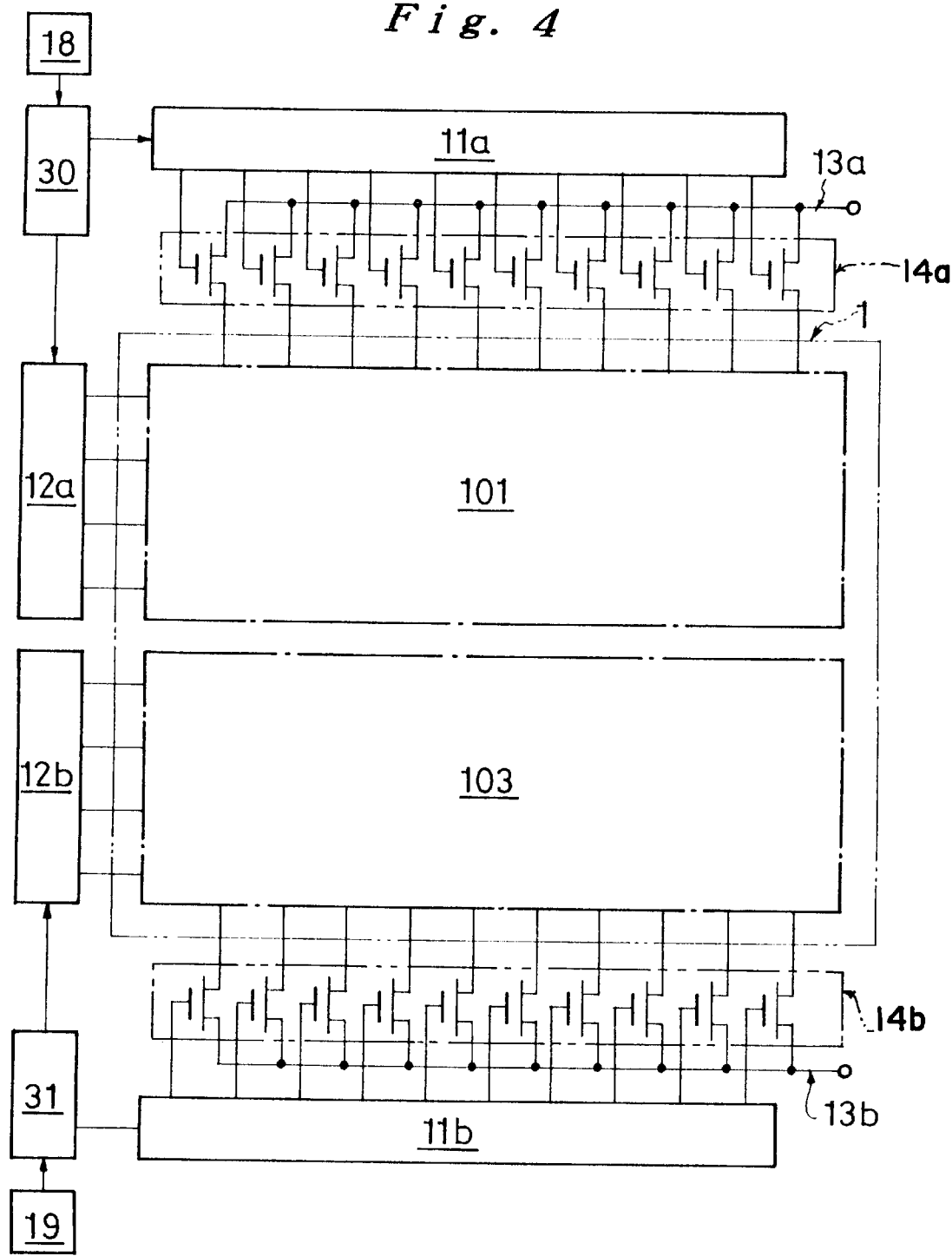
FIG. 4 is a schematic drawing showing another construction for the first semiconductor image sensor.

As shown in FIG. 4, the semiconductor image sensor of the present invention can be constructed also by providing a control circuit which may include horizontal shift registers 11a and 11b, vertical shift registers 12a and 12b, and horizontal scan MOS transistors 14a and 14b for reading in and reading out image signals separately for each respective resolution area. With this construction, the selection and scan of the imaging elements in the low-resolution area 103 can be as fast as in the high-resolution area 101, thus reducing the total time required for the collection of image signals.

Figure 1:
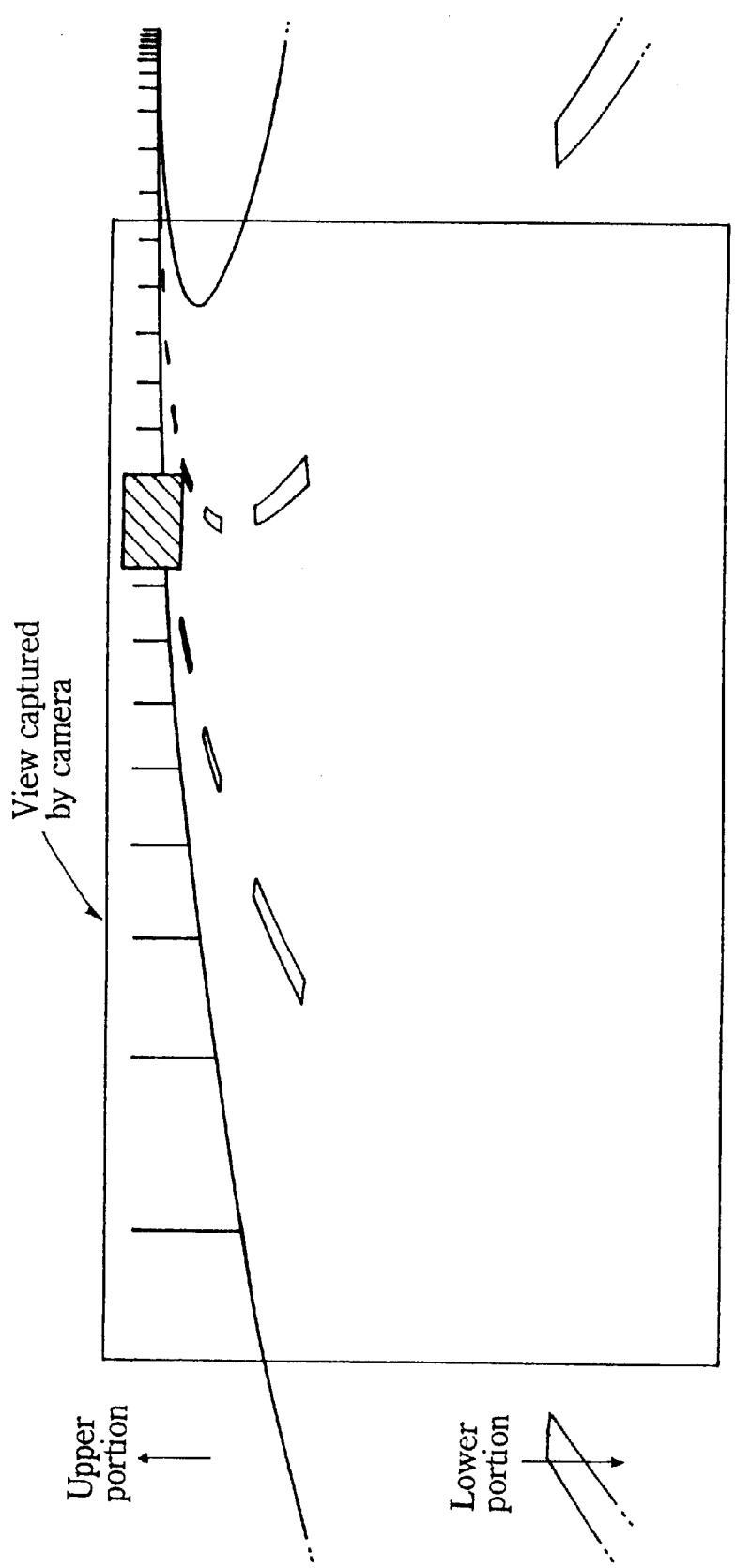
FIG. 1 is a typical example of an image which can be taken by an image sensor for monitoring the forward view of a vehicle.
Figure 5:
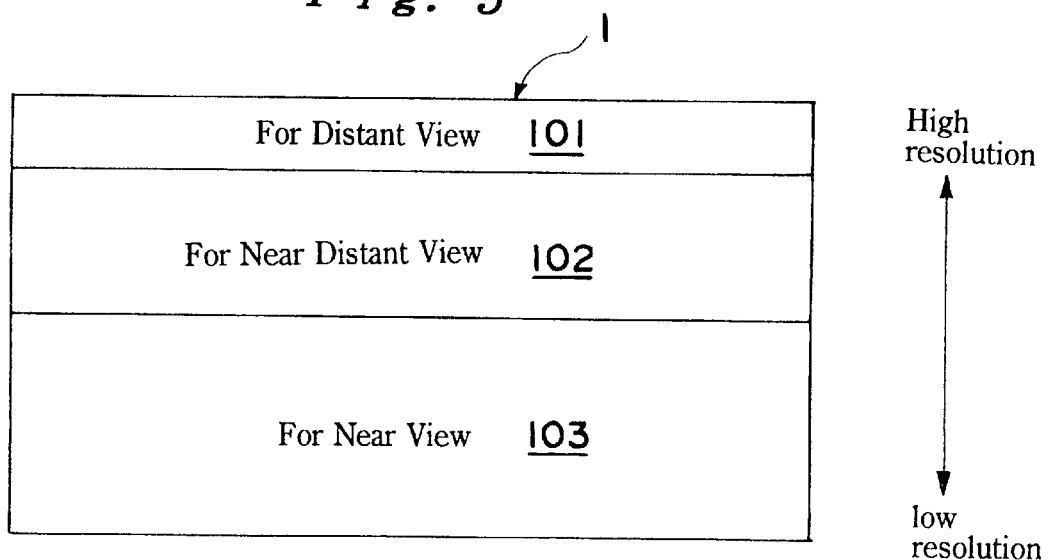
FIG. 5 is an example of semiconductor image sensor whose array of imaging elements is sectioned into three different resolution areas.

The array 1 of imaging elements of the above embodiment comprises two areas of different resolution, one area positioned above the other. However, the present invention is not limited to such partition. The array can be arranged into more areas of different resolution. Since the view shown in FIG. 1 is typical of forward views which are monitored during a drive on a highway by the image sensor mounted on a vehicle, a second embodiment of semiconductor image sensor according to the present invention comprises three areas of different resolution in an array of imaging elements as shown in FIG. 5. The upper section of the array 1 is a high-resolution area 101, which is to monitor distant views. The middle section is a medium-resolution area 102, which is to monitor near distant views, i.e., views seen more than ten meters ahead but less than a hundred meters away. The lower section of the array is a low-resolution area 103, which is to monitor near views that require a wide angle of view and a relatively little resolution. These three sections of different resolution comprise a single imaging device. This arrangement is most suitable to the image sensor which is applied to a system of car navigation because objects in the distance are clearly captured while the fidelity of near objects in the image is appropriately reduced, thus effectively lightening the load of the image processing which is required in car navigation.

Figure 6:
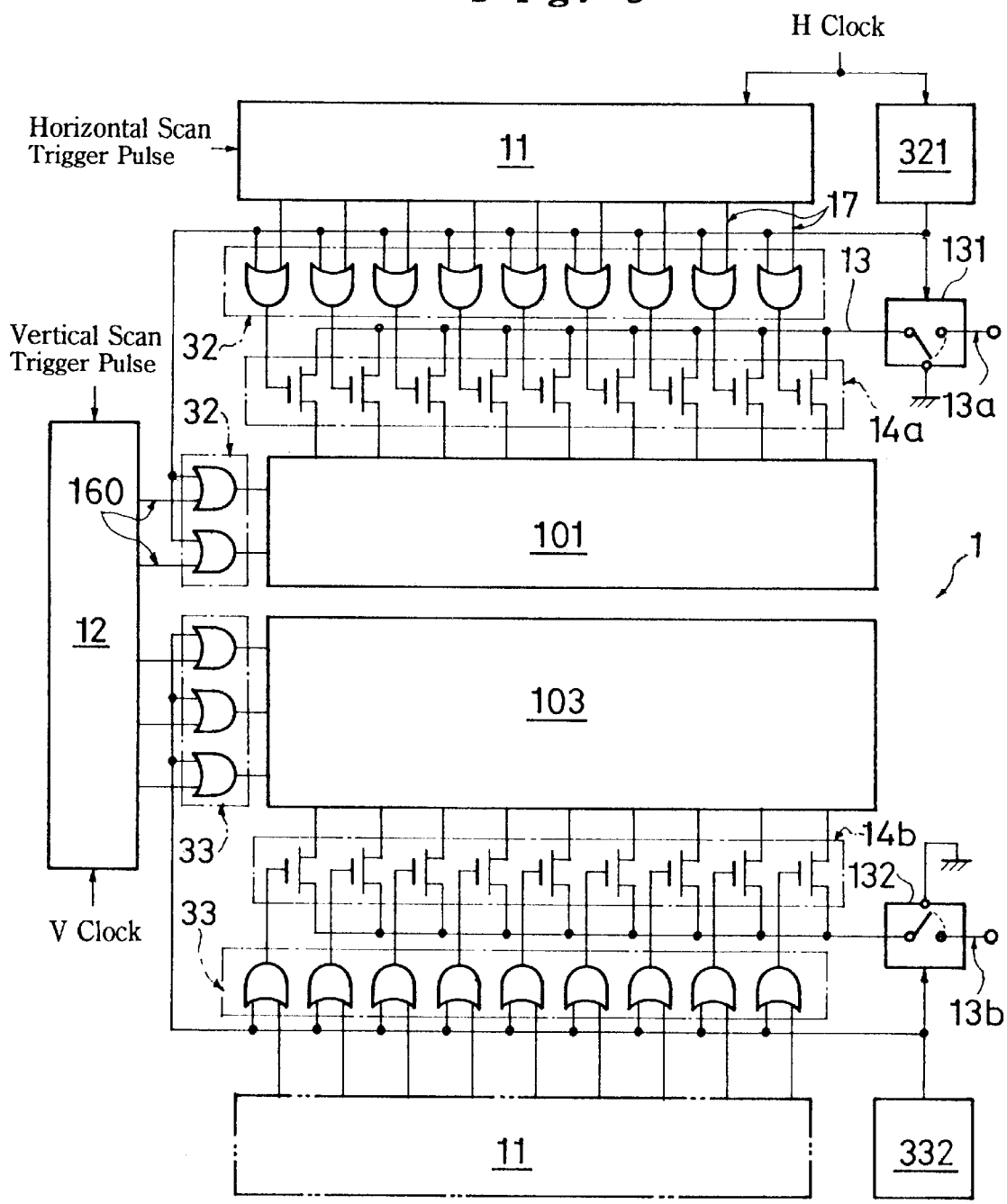
FIG. 6 is a schematic drawing of a semiconductor image sensor, showing a construction which includes circuits to control the shutter speeds.

FIG. 6 shows a third embodiment of semiconductor image sensor according to the present invention. This semiconductor image sensor comprises two areas of different resolution, and a circuit for controlling the shutter speed (hereinafter referred to as "shutter-speed control circuit") is provided independently for each respective area of different resolution. The shutter-speed control circuit for the high-resolution area 101 includes two-input OR gates 32, which are provided in the same number with the horizontal scan selection lines 17. Each OR gate 32 is positioned between a horizontal scan selection line 17, which receives a pulse from the horizontal shift register 11, and the gate of a respective horizontal scan transistor 14a. While one input terminal of each two-input OR gate 32 is connected to a respective horizontal scan selection line 17, the other input is connected to the output terminal of a shutter-speed determination circuit 321, which sets a time for discharging the signal charges.

Likewise, in the vertical direction of the array 1, two-input OR gates 32 are provided in the same number as that of the vertical scan selection lines 160 provided for the high-resolution area 101. These OR gates 32 are each positioned between a respective vertical scan selection line 160, which receives a pulse from the vertical shift register 12, and the gate of a respective vertical scan transistor 22 (refer to FIG. 3). While one input terminal of each two-input OR gate 32 is connected to a respective vertical scan selection line 160 in the high-resolution area 101, the other input terminal is connected to the output terminal of the shutter-speed determination circuit 321. In addition, an analog switch 131 is provided at the output terminal of the image output line 13. Normally, this analog switch 131 is closed so that the image output line 13 is conductive to the output terminal 13a. However, the analog switch 131 is grounded for a time period which is set to discharge the signal charges in synchronization with the pulse which is generated by the shutter-speed determination circuit 321 (hereinafter, this pulse is referred to as "exposure control pulse").

In the same manner, the shutter-speed control circuit for the low-resolution area 103 comprises a shutter-speed determination circuit 332, OR gates 33 and an analog switch 132.

Because these shutter-speed control circuits are provided separately and independently one for the high-resolution area and the other for the low-resolution area, each shutter-speed control circuit is operated independently for a respective resolution area.

With this construction, as the selection pulse or scanning pulse is applied to the gate of each vertical scan transistor 22 or horizontal scan transistor 14, the exposure control pulse is applied by the shutter-speed determination circuit 321 or 332 directly and simultaneously to the gate of each transistor to discharge all the signal charge in each imaging element 2 to the outside of the imaging device. This discharge enables the setting of a new exposure. Therefore, the intensity of the image can be adjusted freely by extending or shortening the exposure time.

For example, in the case of a semiconductor image sensor which comprises an array 1 whose upper portion is set as a high-resolution area 101 for capturing distant views and whose lower portion is set as a low-resolution area 103 for capturing near views, the exposure time is set longer for the high-resolution area 101 than for the low-resolution area 103 because distant views will change slowly while near views are changing quickly during a drive of the vehicle. With this arrangement of the resolution areas, distant objects are clearly captured in the high-resolution area 101 with a relatively long exposure time while the sharpness of the image of near objects is being maintained with a relatively short exposure time.

Such shutter-speed control circuit can be constructed in another way without providing a shutter-speed determination circuit 321 or 332, OR gates 32 or 33, etc. For example, as shown in FIG. 4, each section of the array with a different resolution can be provided with a clock signal generator 18 or 19 and a control circuit 30 or 31 which controls a respective shift register in correspondence with the clock signal generated by the corresponding clock signal generator. In this case, the clock signals generated are used to control the image framing time of a respective resolution area individually.

Figure 7:
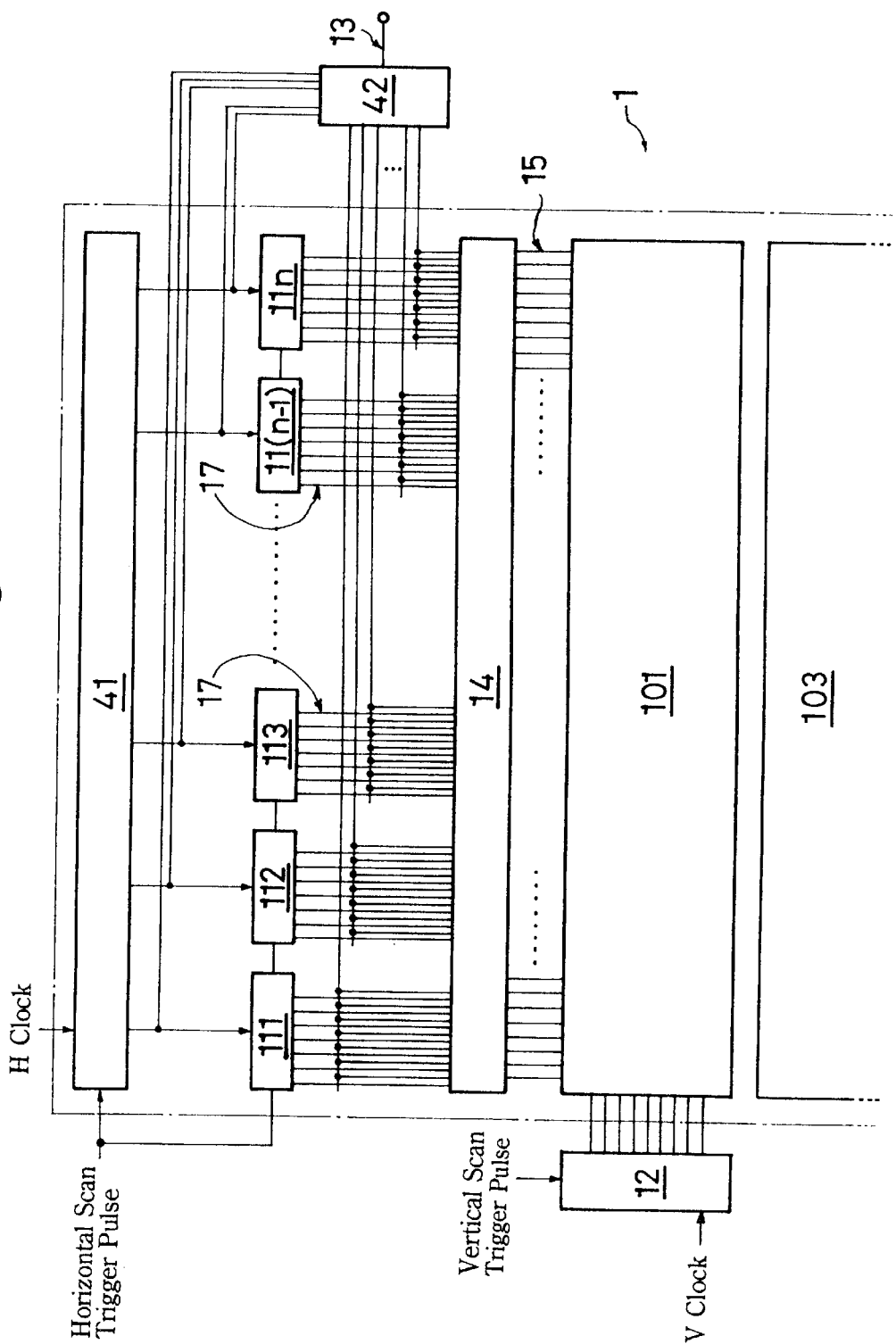
FIG. 7 is a schematic drawing of a semiconductor image sensor, showing a construction which includes a circuit to collect partial images.

FIG. 7 shows a fourth embodiment of semiconductor image sensor according to the present invention. This semiconductor image sensor is capable of partially and selectively collecting image signals, i.e., outputs of imaging elements, from the high-resolution area 101 in the array 1. In this embodiment, a circuit for collecting image signals in a block (hereinafter referred to as "image signal partial collection circuit") is provided with a circuit to select a specific horizontal shift register (hereinafter referred to as "horizontal shift register selection circuit") 41 and an output selection circuit 42 provided on the image output line 13.

The array 1 generally comprises several hundred of imaging elements in both horizontal and vertical directions. For the scanning of the array, the horizontal shift register 11 generates scanning pulses, which are supplied to the horizontal scan selection lines 17 consecutively one line after another for the horizontal scan of each row of imaging elements. For this reason, the period of the scanning pulse equals the period of the selection pulse divided by the number of columns of imaging elements. In other words, while a row of imaging elements is being selected by the application of a selection pulse through a respective vertical scan selection line, the horizontal shift register 11 must generate the same number of pulses as the number of columns of imaging elements for the horizontal scan. In this design, the horizontal shift register 11, which is a relatively large shift register, may be composed of a number of small size shift registers. For example, 50-bit shift registers can be applied in series from 111 to 11*n* as shown in the figure, representing the shift register 11 as a whole.

With this construction, if there is a need to display only a portion of the image which is captured in the high-resolution area 101, e.g., for the purpose of magnification, then the small size shift registers which are connected through respective horizontal scan selection lines 17 to the section of imaging elements which corresponds to a desired portion of the image (for example, the shift registers from 112 to 119) are selected by the horizontal shift register selection circuit 41 so that only the image signals of the vertical signal lines 15 which respond to these specific shift registers are output to the image output line 13.

Alternatively, while all the horizontal scan selection lines 17 are supplied with scanning pulses, the output selection circuit 42 can extract only the image signals of the vertical signal lines 15 which respond to the respective horizontal scan selection lines 17 that are connected to the small size shift registers, for example, from 112 to 119. On the other hand, if time saving is desired, scanning pulses are applied only to the horizontal scan selection lines 17 which are connected to the shift registers, for example, from 112 to 119 selected by the horizontal shift register selection circuit 41, and only the image signals which will produce the desired portion of the image are extracted to the image output line 13.

With this design, because the image signals are selectively extracted to the image output line 13, the load is significantly reduced for the succeeding processes of image processing. For example, while the vehicle is driving through a tunnel, the monitoring can be carried out by extracting only the image signals which are coming from a specific, central or target section of the high-resolution area 101. In such a condition, this semiconductor image sensor will not take in all the image signals of the high-resolution area 101 for the purpose of reducing the amount of information to be processed for image formation.

Figure 8:
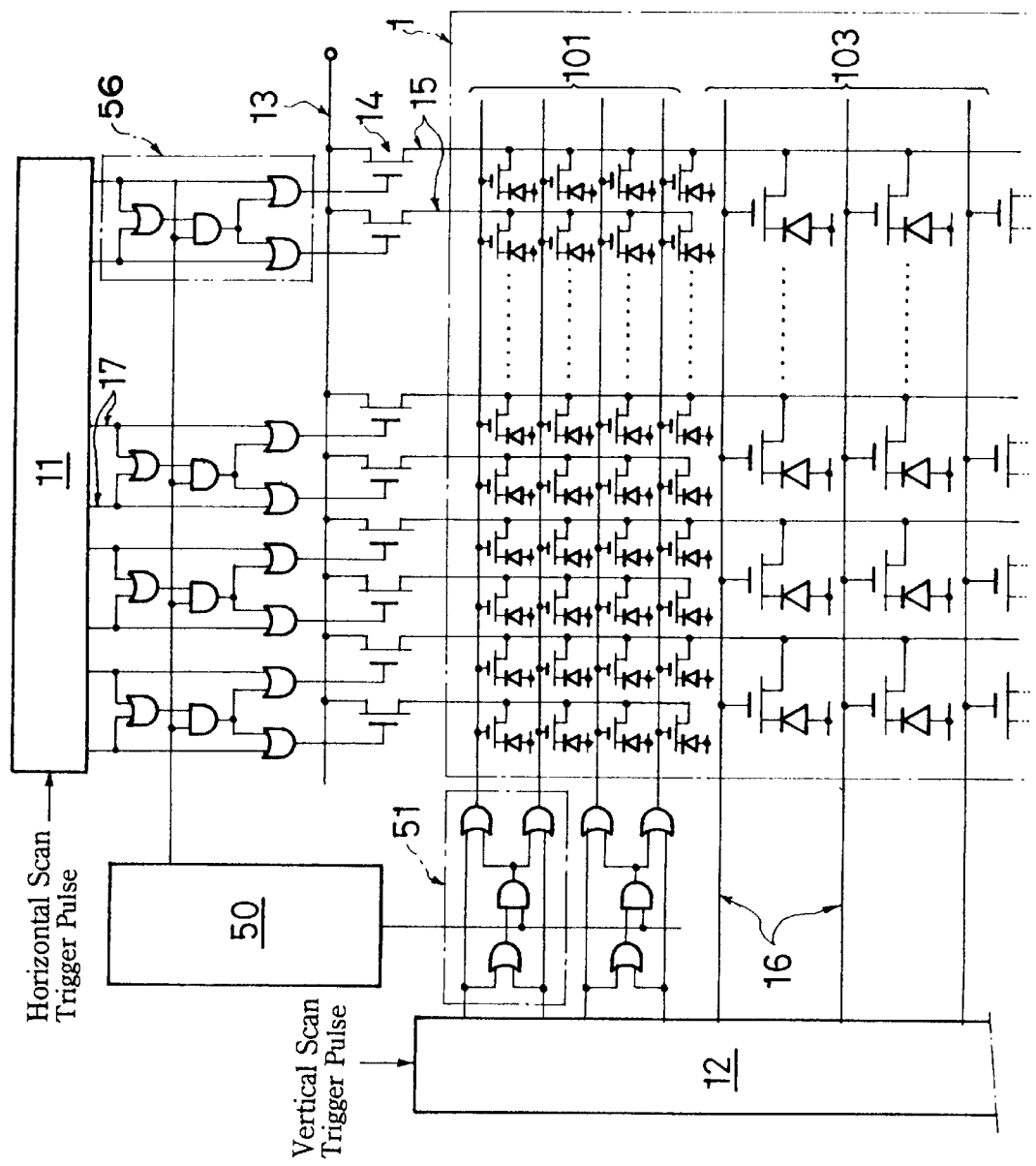
FIG. 8 is a schematic drawing of a semiconductor image sensor, showing a construction which includes a circuit to group the outputs of a plurality of imaging elements as a single output.

FIG. 8 shows a fifth embodiment of semiconductor image sensor. This semi conductor image sensor is capable of combining the image signals of every four adjacent imaging elements in the high-resolution area 101 as a single unified image signal. This feature is advantageous when high resolution is not desired, for example, in a case where the vehicle is facing a mountain during a drive on a road in a mountainous region. This semiconductor image sensor comprises circuits to combine two adjacent horizontal scan selection lines 17 (these circuits are hereinafter referred to as "horizontal scan selection line combining circuits"). The number of the horizontal scan selection line combining circuits 56 actually provided is exactly half the number of the horizontal scan selection lines 17. Each horizontal scan selection line combining circuit 56 is positioned between every two horizontal scan selection lines 17, which are connected to the horizontal shift register 11, and the gates of two corresponding horizontal scan transistors 14.

Likewise in the vertical direction of the array 1 of FIG. 8, this semiconductor image sensor comprises circuits to combine two adjacent vertical scan selection lines 16 (these circuits are hereinafter referred to as "vertical scan selection line combining circuits"). The number of the vertical scan selection line combining circuits 51 actually provided is exactly half the number of the vertical scan selection lines 16 which are provided in the high-resolution area 101. Each vertical scan selection line combining circuit 51 is positioned along the vertical shift register 12 between every two vertical scan selection lines 16 coming from the vertical shift register 12 which are provided in the high-resolution area 101 and the gates of two corresponding vertical scan transistors 22 (refer to FIG. 3).

Figure 9:
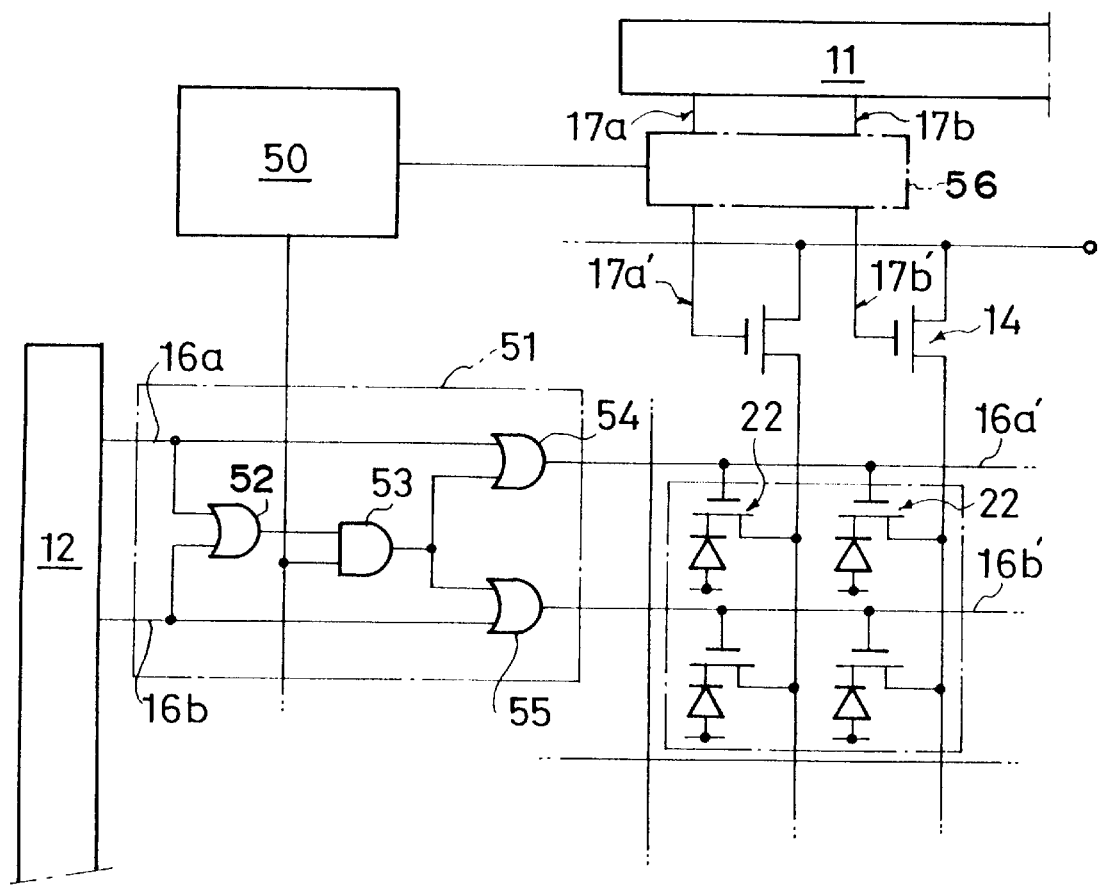
FIG. 9 is a schematic drawing showing the construction of a circuit which combines vertical scan selection lines.

FIG. 9 shows the construction of the vertical scan selection line combining circuit 51. This circuit comprises three OR gates and one AND gate. Two adjacent vertical scan selection lines 16*a* and 16*b* of the vertical scan selection lines 16, which are coming out from the vertical shift register 12, are connected each to an input terminal of an OR gate 52. The output terminal of this OR gate 52 is connected to an input terminal of the AND gate 53. The other input terminal of the AND gate 53 is connected to a circuit 50 which selects a resolution (hereinafter referred to as "resolution selection circuit"). The output terminal of the AND gate 53 is connected to an input terminal of an OR gate 54, whose other input terminal is connected to the vertical scan selection line 16*a*. The output terminal of this OR gate 54 is connected to the vertical scan selection line 16*a*' which succeeds the original vertical scan selection line 16*a* and leads to the gates of a row of vertical scan transistors 22. In this circuit, the AND gate 53 can receive a control signal from the resolution selection circuit 50. The logical sum of the output of the AND gate 53 and the selection pulse supplied through the vertical scan selection line 16*a* is calculated at the OR gate 54, and the output of the OR gate 54 is supplied to the respective transistors 22 through the vertical scan selection line 16*a*'.

In this circuit, the output terminal of the AND gate 53 is also connected to the input terminal of the OR gate 55, whose other input terminal is connected to the vertical scan selection line 16*b*. The output terminal of this OR gate 55 is connected to the vertical scan selection line 16*b*' which succeeds the original vertical scan selection line 16*b* and leads to the gates of another row of vertical scan transistors 22. In this circuit, the logical sum of the output of the AND gate 53 and the selection pulse supplied through the vertical scan selection line 16*b* is also calculated at the OR gate 55, and the output of the OR gate 55 is supplied to the respective transistors 22 through the vertical scan selection line 16*b*'. This construction of the vertical scan selection line combining circuits 51 are also applied in the same manner to the above mentioned horizontal scan selection line combining circuits 56.

Now, a description will be made of the operation of the vertical and horizontal scan selection line combining circuits 51 and 56. For selecting the originally assigned high resolution, the output of the resolution selection circuit 50 is set to a relative low level, which makes the outputs of the AND gates 53 remain at the low level. In this condition, selection pulses applied from the vertical shift register 12 through the vertical scan selection lines 16*a* and 16*b* pass directly through the OR gates 54 and 55 and vertical scan selection lines 16*a*' and 16*b*' to the corresponding rows of vertical scan transistors 22, respectively.

In response to the shift of the vertical shift register 12, as each selection pulse is supplied to a respective vertical scan selection line 16*a* or 16*b* one after another, the image signals from the row of imaging elements which are connected to the respective vertical scan selection line are extractable sequentially to the image output line 13. All the while, the horizontal shift register 11 operates in the same manner supplying each scanning pulse to a respective horizontal scan selection line 17*a* or 17*b* of the horizontal scan selection lines 17 one after another in synchronization with the operation of the vertical shift register 12 but with a different frequency appropriate for the horizontal scan of each respective row of imaging elements which is selected by the application of each selection pulse. As a result, the image signal of every imaging element of the high-resolution area 101 in the array is extracted consecutively to the image output line 13.

On the other hand, if the original high resolution is not desired of the high-resolution area 101, then the output of the resolution selection circuit 50 is set to a relative high level, which makes the AND gate 53 stay open. As a result, the selection pulse applied to the vertical scan selection line 16a flows both to the vertical scan selection line 16a' and to the vertical scan selection line 16b' simultaneously, passing through the OR gates 54 and 55, respectively. Then, upon the shift of the vertical shift register 12, the selection pulse applied to the vertical scan selection line 16b also flows both to the vertical scan selection line 16a' and to the vertical scan selection line 16b' simultaneously, passing through the OR gates 54 and 55, respectively. As such, while every two consecutive selection pulses are supplied to both respective vertical scan selection lines 16a and 16b simultaneously, every two corresponding rows of imaging elements are selected simultaneously allowing the image signals thereof to transmit to the vertical signal lines 15. Thus, in effect, the resolution selection circuit 50 makes every two rows of imaging elements in the high-resolution area 101 behave as if they were just a single row.

This same effect is attained also in the horizontal scan. The scanning pulses supplied to the horizontal scan selection lines 17 are treated by the horizontal scan selection line combining circuits 56 in the same manner as the selection pulses are treated by the vertical scan selection line combining circuits 51 in the vertical scan so that the image signals of every two vertical signal lines 15 are extracted simultaneously as a combined or unified image signal to the image output line 13 consecutively. As a result, the net effect is that every four adjacent imaging elements, two elements vertically and two elements horizontally, in the high-resolution area 101 will work as if they were a single imaging element. In this embodiment, the semiconductor image sensor is constructed to make every four adjacent imaging elements 2 produce a single image signal. However, the design can be varied to make every nine adjacent imaging elements or any desired number of adjacent imaging elements produce a single image signal.

Moreover, for example, if the high-resolution area 101 is constructed with a resolution four times that of the low-resolution area 103 and with the feature which makes every four adjacent imaging elements of the high-resolution area produce a single image signal, then turning on this feature enables the semiconductor image sensor to acquire a uniform resolution over the whole array. In addition, the semiconductor image sensor capable of combining the image signals of every adjacent imaging elements in the high-resolution area 101 can effectively reduce the load of the subsequent image processing of the system without losing necessary information when this feature is utilized appropriately in correspondence with the change of the views which may not require high resolution.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor image sensor comprising:
   a multiplicity of photosensitive elements provided as a two dimension array on a substrate, an output of each of said photosensitive elements being an image signal;

wherein:
   a plurality of separate and different resolution areas are provided in a photosensitive portion on said substrate comprised of a like plurality and location of separate areas of different densities of said photosensitive elements in the array for sensing an entire image in said photosensitive portion;
   said separate areas being arranged vertically, one above another, across the entire horizontal width of the photosensitive portion;
   said separate areas located on an upper portion of said photosensitive portion in the vertical direction comprise high resolution areas for imaging objects at a distance from the sensor for a distant view, said high resolution areas having a high density of said photosensitive elements in both the vertical direction and the horizontal direction; and
   said separate areas located on a lower portion of said photosensitive portion in the vertical direction comprise low resolution areas for imaging objects near the sensor for a near view, said low resolution areas having a low density of said photosensitive elements in both the vertical direction and the horizontal direction, and said low density of photosensitive elements being of a lower density than said high density of photosensitive elements in both the vertical and horizontal directions.

2. The semiconductor image sensor as set forth in claim 1 further comprising:
   shutter-speed control circuits independently provided for each of said separate and different resolution areas;
wherein:
   each of said shutter-speed control circuits is used to variably set a shutter speed for a respective separate and different resolution area of said separate and different resolution areas.

3. The semiconductor image sensor as set forth in claim 1 further comprising:
   clock signal generators each independently provided for each of said separate and different resolution areas;
wherein:
   a clock signal of each of said clock signal generators is used to variably set a framing time for a respective separate and different resolution area of said separate and different resolution areas.

4. The semiconductor image sensor as set forth in claim 1 further comprising:
   a circuit for partially collecting outputs, i.e., image signals, of the photosensitive elements of at least a high-resolution area in said array so that such partially collected image signals can be used for magnification of a part of an image.

5. The semiconductor image sensor as set forth in claim 1 further comprising:
   a circuit for grouping a plurality of adjacent photosensitive elements to extract therefrom a single unified image signal;
wherein:
   one said separate and different resolution area on said substrate is a high-resolution area in which each photosensitive element gives an image signal; and
   said one area is transformed to a low-resolution area when said circuit groups a plurality of adjacent photosensitive elements to produce a single unified image signal.

6. The semiconductor image sensor of claim 1, wherein said sensor is provided on a land vehicle and pointed substantial horizontally for sensing said entire image comprised of the land and objects from near the vehicle to said distance from the vehicle.

7. A semiconductor image sensor comprising, a two dimensional photosensitive area with an array of a multiplicity of photosensitive elements for sensing an entire image, said photosensitive area comprised of at least two separate areas arranged vertically, one above another, across the entire horizontal width of the photosensitive area, and each said separate area having a different number of said photosensitive elements per unit of area for causing different densities of said photosensitive elements in said separate areas for producing different levels of image resolution from different said separate areas for the entire image, said separate areas located on an upper portion of said photosensitive portion in the vertical direction comprise high resolution areas for imaging objects at a distance from the sensor for a distant view, said high resolution areas having a high density of said photosensitive elements in both the vertical direction and the horizontal direction, said separate areas located on a lower portion of said photosensitive portion in the vertical direction comprise low resolution areas for imaging objects near the sensor for a near view, said low resolution areas having a low density of said photosensitive elements in both the vertical direction and the horizontal direction, and said low density of photosensitive elements being of a lower density than said high density of photosensitive elements in both the vertical and horizontal directions.

8. The semiconductor image sensor of claim 7, wherein said at least two separate areas include a first rectangular area of one level of resolution and located directly above a second rectangular area of another level of resolution.

9. The semiconductor image sensor of claim 8, wherein said first and second rectangular areas comprise the entire said photosensitive area.

10. The semiconductor image sensor of claim 8, wherein a third rectangular area is located below said second rectangular area and has a level of resolution lower than said first and second rectangular areas.

11. The semiconductor image sensor of claim 10, wherein said first, second and third rectangular areas comprise the entire said photosensitive area.

12. The semiconductor image sensor of claim 7, wherein said sensor is provided on a land vehicle and pointed substantial horizontally for sensing said entire image comprised of the land and objects from near the vehicle to said distance from the vehicle.

\* \* \* \* \*